United States Patent [19]

Gutman

[11] Patent Number: 5,420,488
[45] Date of Patent: May 30, 1995

[54] VACUUM NOZZLE HAVING DYNAMICALLY ADJUSTABLE PLACEMENT FORCE

[75] Inventor: Jose Gutman, Boynton Beach, Fla.

[73] Assignee: Motorola, Inc., Schaumburg, Ill.

[21] Appl. No.: 161,161

[22] Filed: Dec. 3, 1993

[51] Int. Cl.⁶ .................... B65H 11/02; G01N 33/00
[52] U.S. Cl. ................ 318/568.12; 318/662; 318/687; 318/568.1
[58] Field of Search .................... 318/560-646; 901/3.5, 7.9, , 12, 13, 15-23; 427/8, 425; 118/664-697, 704, 319, 500; 414/225, 751, 758, 773; 346/140 R; 239/434, 600; 51/439; 29/568; 483/7

[56] References Cited

U.S. PATENT DOCUMENTS

| | | | |
|---|---|---|---|
| Re. 33,910 | 5/1992 | Compton | 82/18 |
| 4,463,300 | 7/1984 | Mayne et al. | 318/687 |
| 4,615,101 | 10/1986 | Edwards et al. | 29/568 |
| 4,628,499 | 12/1986 | Hammett | 364/167 |
| 4,657,470 | 4/1987 | Clarke et al. | 414/627 |
| 4,725,327 | 2/1988 | Matuda et al. | 156/351 |
| 4,806,070 | 2/1989 | Poux et al. | 901/39 X |
| 4,871,058 | 10/1989 | Shields | 198/444 |
| 4,877,138 | 10/1989 | Motiwala | 209/601 |
| 4,888,082 | 12/1989 | Fetcenko et al. | 156/500 |
| 4,901,625 | 2/1990 | Bussan et al. | 91/361 |
| 4,983,893 | 1/1991 | Miyashita et al. | 318/135 |
| 4,986,410 | 1/1991 | Shields | 318/662 X |
| 5,104,621 | 4/1992 | Pfost et al. | 422/67 |
| 5,108,703 | 4/1992 | Pfost et al. | 422/65 |
| 5,244,356 | 9/1993 | Hasegawa | 417/273 |
| 5,308,132 | 5/1994 | Kirby et al. | 294/64.1 |

Primary Examiner—Paul Ip
Attorney, Agent, or Firm—Keith A. Chanroo

[57] ABSTRACT

An apparatus and a method therefor is capable of automated and/or robotic assembly. The apparatus includes a vacuum nozzle (201) for aspirating and securing a component (202, 204). A spring (312) mechanically coupled to the vacuum nozzle (201) provides a variable spring force thereto in a direction of a placing operation (214, 216). The variable spring force varies in response to the vacuum nozzle (201) moving linearly along an axis of the placing operation (214, 216). The variable spring force corresponds to a variable placement force applied by the vacuum nozzle (201) to the component (202, 204). A linear position sensor (110) coupled to the vacuum nozzle (201) senses a variable linear position of the vacuum nozzle (201). The apparatus adjusts the variable placement force applied by the vacuum nozzle (201) to the component (202, 204) by varying the variable linear position of the vacuum nozzle (201).

15 Claims, 8 Drawing Sheets

VACUUM NOZZLE HAVING DYNAMICALLY ADJUSTABLE PLACEMENT FORCE

FIELD OF THE INVENTION

This invention relates in general to the field of automated and/or robotic assembly devices, and more specifically to a device comprising a vacuum nozzle having dynamically adjustable placement force.

BACKGROUND OF THE INVENTION

Automated assembly equipment, including robotic assembly equipment commonly picks and places assembly components using some form of an end effector coupled to a movable supporting structure, for example a robotic arm. When picking and placing the assembly components, a vacuum nozzle is used as an end effector. Typically, a conventional vacuum sensor detects changes in air pressure at the vacuum nozzle that indicates the presence of the assembly component. The assembly component is then placed at the desired location. The vacuum nozzle end effector typically applies a predetermined force to the assembly component in the direction of the placing operation against a surface, such as a surface of a circuit supporting substrate to properly set the assembly component on the circuit supporting substrate.

In the case of surface mount integrate circuit (IC) components, the force pressing the component to the surface of the circuit supporting substrate is necessary to effect contact between each of a plurality of pads and a plurality of pre-soldered contacts, respectively. The plurality of pads and the corresponding plurality of pre-soldered contacts are normally located on opposing surfaces between the IC component and the circuit supporting substrate. Either of the two opposing surfaces can comprise the pads and the other surface, the pre-soldered contacts, such that when the IC component is placed in the predetermined location on the surface of the circuit supporting substrate, the pre-soldered contacts and the pads are mechanically contacting each other, respectively.

Regrettably, after a placement operation, the assembly component, such as a surface mount IC component, may not be electrically connected to a circuit on the circuit supporting substrate due to improper placement force being applied to the component upon being placed on the circuit supporting substrate. For example, a plurality of pads and pre-soldered contacts require a certain amount of force pressing the two opposing surfaces together to allow all the pre-soldered contacts to settle against the respective pads to effect mechanical and electrical contact therebetween, respectively. This condition can be a significant cause of assembly and manufacturing failures, which is unfortunately detected well after all components are assembled on the circuit supporting substrate. The testing, diagnosing, and repair costs can be significant. Also, the quality of the manufactured product can be severely affected, for example, the perceived quality of the consumers.

Additionally, the end effector is usually required to pick and place different types of assembly components on the circuit supporting substrate during an assembly process. These different assembly components usually require different amounts of placement force to properly placed different components on the circuit supporting substrates. For example, different surface mount ICs placed on a circuit board will have different numbers of pads assembled to respective pre-soldered contacts between the ICs and the circuit board. That is, the number of contacts between the different IC components and the surface of the circuit supporting substrate can vary from placement of a first IC to placement of a second IC. The varying number of contacts between placement operations can require different amounts of placement force to effectively place the different IC components on the circuit supporting substrate for making electrical contact therebetween.

Thus what is needed is flexible manufacturing stations that can pick and place different types of components with a high placement accuracy and with minimal supervision. Particularly, with surface mount technology, the large volumes of production dictate that an automated or robotic approach be used to maintain competitiveness in the marketplace. The end effector must be flexible from placement operation to placement operation for performing accurate and repeatable component placements by dynamically adjusting according the components being placed.

SUMMARY OF THE INVENTION

In carrying out one form of this invention, there is provided an apparatus and a method therefor for automated assembly, including robotic assembly. The apparatus comprises a vacuum nozzle for aspirating and securing a component. A spring is mechanically coupled to the vacuum nozzle for providing a variable spring force thereto in a direction of a placing operation. The variable spring force varies in response to the vacuum nozzle moving linearly along an axis of the placing operation. The variable spring force corresponds to a variable placement force applied by the vacuum nozzle to the component in the direction of the placing operation. A linear position sensor is coupled to the vacuum nozzle for sensing a variable linear position of the vacuum nozzle along the axis of the placing operation and for providing a position indication signal representing the linear position of the vacuum nozzle. The apparatus adjusts the variable placement force applied by the vacuum nozzle to the component. The variable linear position of the vacuum nozzle corresponds to the variable placement force applied to the component in the direction of the placing operation.

DESCRIPTION OF THE PREFERRED EMBODIMENTS

Figure 1:
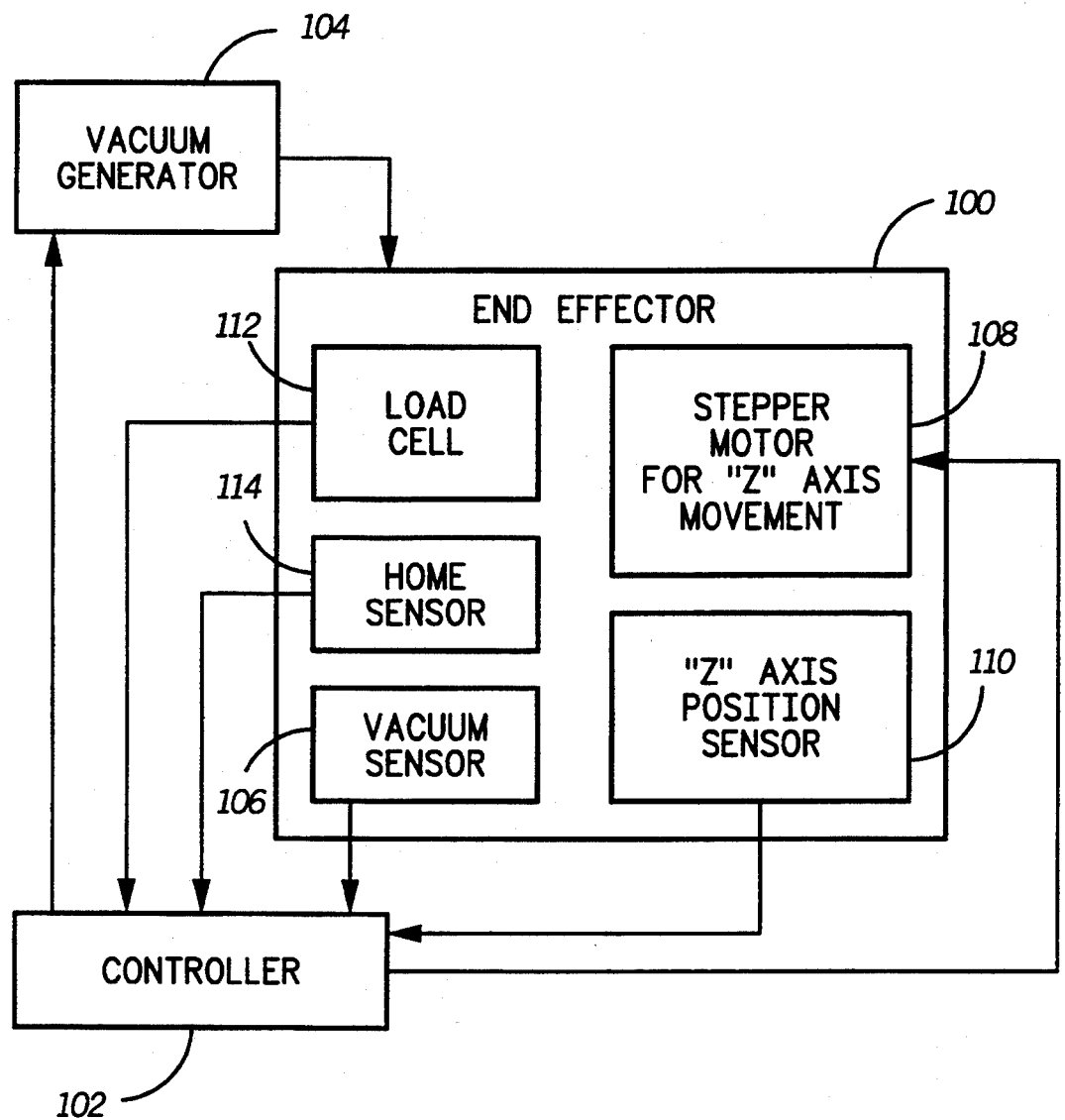
FIG. 1 is a block diagram illustrating a vacuum nozzle end effector in accordance with the preferred embodiment of the present invention.

Referring to FIG. 1, a block diagram illustrates an arrangement of an equipment for use in an automated placement process. The automated placement equipment comprises an end effector 100 for picking and placing components, for example, in a manufacturing or assembly process. The end effector 100 includes a vacuum nozzle (not shown) which engages a component, for example, an integrated circuit device (IC), by means of a vacuum provided by a controllable vacuum generator 104 which is coupled to the end effector 100. A controller 102 is electrically coupled to the vacuum generator 104 for controlling the vacuum generator 104 to provide a vacuum (aspirating) at the nozzle as necessary to pick and place (to secure) a component. A vacuum sensor 106 at the end effector 100 senses the presence of a vacuum at the nozzle to determine when a component has been engaged at the nozzle. The vacuum sensor 106 is electrically coupled to the controller 102 to provide the indication that a component has been captured (or coupled) at the nozzle. Hence, the combination of vacuum nozzle end effector 100, the vacuum generator 104, the vacuum sensor 106, and the controller 102 can be utilized to pick and place (secure) components, such as in a manufacturing process.

A decision process at the controller 102 controls the automated placing equipment to move the end effector 100 in position to pick up a component, for example an IC, component, from a predetermined location. The end effector 100 can then move to locate the component on a work area, for example a surface of a circuit supporting substrate, for placement thereon.

When the vacuum nozzle is at the predetermined location to pick the component, the controller 102 activates the vacuum generator 104 to provide a vacuum at the nozzle for engaging the component. Subsequently, when the end effector 100 moves into position to locate the captured component at the desired location on the circuit supporting substrate, the controller 102 disables the vacuum generator 104 for removing the vacuum from the nozzle and thereby releasing the component at the desired location which places the component on the desired location. The vacuum sensor 106 provides feedback to the controller 102 for monitoring the engaging and releasing of the component at the vacuum nozzle during the placing operation.

In summary, the vacuum nozzle end effector 100 as discussed above by means of aspiration can pick and place components on a circuit supporting substrate, for example, typically utilizing a predetermined placement force for placing a component on the circuit supporting substrate. For example, when the component is located on the surface of the circuit supporting substrate at the desired location, the end effector 100 applies a placement force on the component and in the direction of the placing operation to set the component at the location. The end effector 100 presses the component down onto the surface of the circuit supporting substrate with a predetermined force. As long as the end effector 100 continues placing identical components, the placement force utilized by the end effector 100 will remain constant from placing operation to placing operation. However, in a flexible manufacturing environment, the automated placing equipment must be able to pick and place different types of components requiring different amounts of placement force to be placed, or different rates of change in the amount of placement force being applied, or both. The requirements of a flexible manufacturing process are successfully addressed by the embodiments of the present invention which will be discussed below.

The end effector 100 further includes a linear actuator 108, that is electrically coupled to the controller 102 and can be controlled thereby for providing a pre-loading force on the vacuum nozzle of the end effector 100 for varying a range of placement force that can be applied during a placing operation, as will be discussed below. Also, three feedback mechanisms are electrically coupled to the controller 102 for controlling and adjusting the placement force being applied to a component during a placing operation. First, a linear position sensor ("Z" axis position sensor) 110 provides a position indication signal to the controller 102 to indicate the amount and rate of change of the placement force being applied by the vacuum nozzle on the component. Second, a load cell 112 contains a strain gauge for providing a feedback signal to the controller 102 for indicating when the vacuum nozzle is applying a desired placement force on the component. A home sensor 114 is utilized to provide feedback to the controller 102 to indicate when the vacuum nozzle is in an initialized position and ready for a new placement operation. The structure and function of these and other sub-modules in the automated placing equipment are more fully described in the following discussion.

Figure 2:
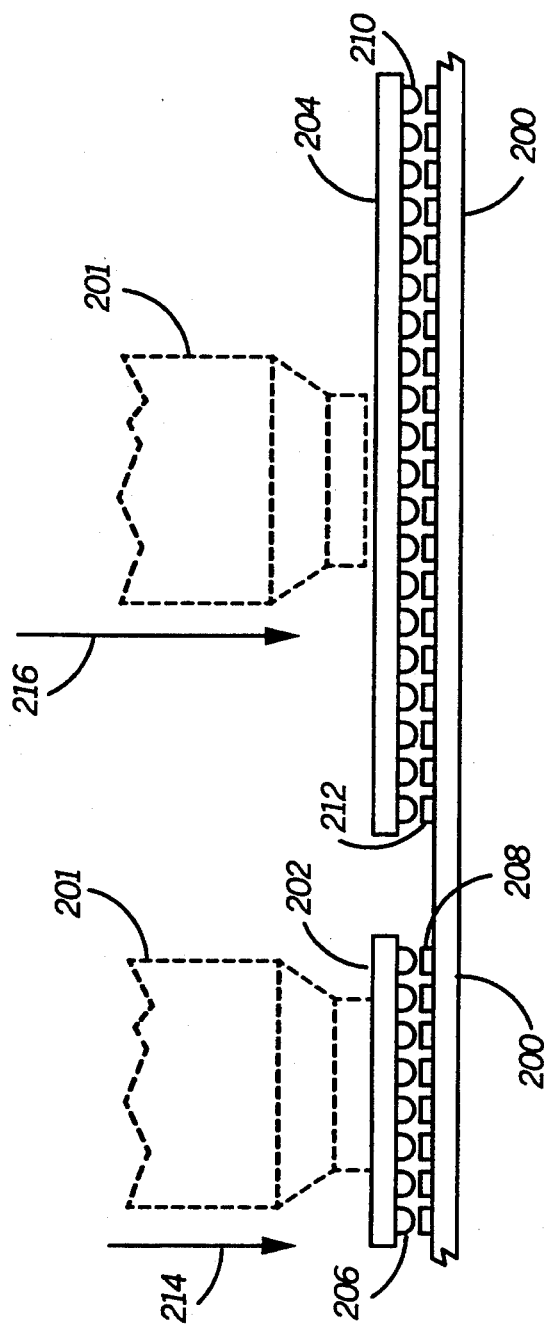
FIG. 2 is a side view of a vacuum nozzle placing components on a circuit supporting substrate according to the preferred embodiment of the present invention.

FIG. 2 illustrates a vacuum nozzle 201 in two placement operations. The vacuum nozzle 201 picks and places a first component 202, and then picks and places a second component 204, where the first placement force 214 is less than the second placement force 216. The different amount of placement force required between the first placement operation and the second operation can be due to the number of pre-soldered interconnections between the respective first and second components (202, 204) and a circuit supporting substrate 200 or simply the difference in sizes of the first and second components (202, 204) as shown. The first component, for example an IC device 202, may comprise a first number of pre-soldered contacts 206 which correspond to a first number of pads 208 located on the circuit supporting substrate 200. The second component 204, for example a second IC device, may comprise a second number of pre-soldered contacts 210 which correspond to a second number of pads 212 on the circuit supporting substrate 200. The vacuum nozzle 201 usually requires a greater amount of placement force 216 in the second placing operation as compared to the placement force 214 in the first placement operation because the number of pre-soldered interconnections is greater on the second component 204 as compared to the first component 202. Therefore, by applying the greater placement force 216 in the second placing operation the vacuum nozzle 201 presses the component 204 down harder onto the surface of the circuit supporting substrate 200. The additional placement force forces all the pre-soldered contacts 210, or bumps, of the component 204 into contact with the corresponding pads 212 on the circuit supporting substrate 200.

Further, in certain applications, it may be advantageous to apply gradually increasing placement force to a component to help set the contacts between the component 204 and the circuit supporting substrate 200. The rate of change of a placement force, e.g., an increasing placement force, can be monitored according to an embodiment of the present invention to provide the advantage, for example, of gradually increasing a placement force up to a desired amount. According to the preferred embodiment of the present invention, an automated placing equipment varies the amount of placement force applied to a component and monitors the rate of change of the varying placement force to control the rate of change of the varying placement force while adjusting to a predetermined amount of placement force to applied to the component. This advantageous aspect of the present invention will be more fully discussed below.

Figure 3:
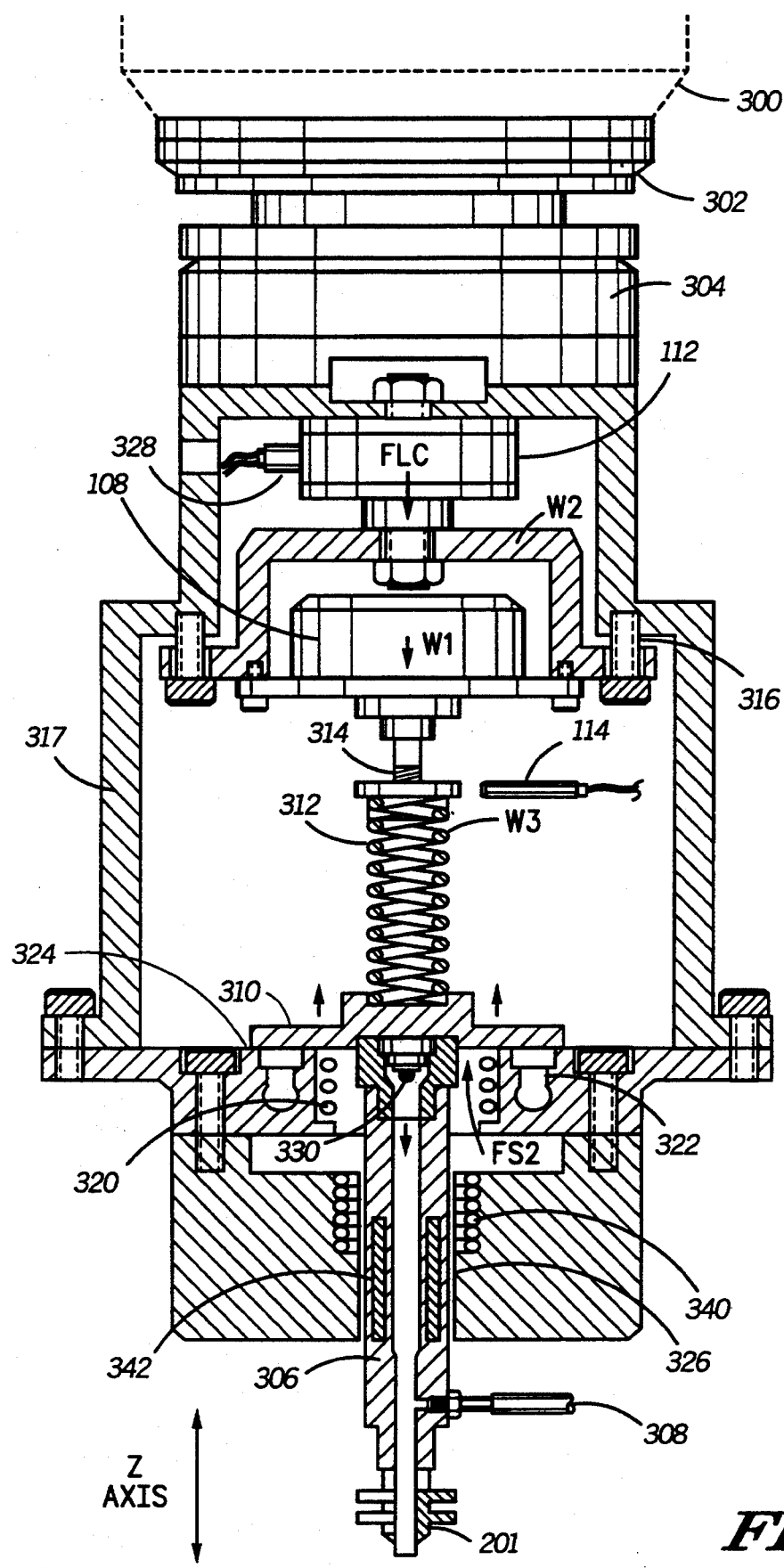
FIG. 3 is a cross-sectional side view of a vacuum nozzle end effector in accordance with a preferred embodiment of the present invention.

FIG. 3 is a cross-sectional side view of the vacuum nozzle end effector 100 according to the preferred embodiment of the present invention. A breakaway coupler 302 couples the end effector 100 to a moveable arm 300, for example a robotic arm. Optionally, a tool changing coupler 304 can be included with the end effector 100 to facilitate changing the end effector 100 for another end effector. Hence, the breakaway coupler 302 and the optional tool changer 304 provide means of coupling the end effector 100 to, for example, the robotic arm.

The vacuum nozzle 201 is mechanically coupled to a vacuum quill 306 which provides structural support for the vacuum nozzle 201 and mechanically couples the vacuum nozzle 201 to the end effector 100. The vacuum quill 306 comprises a vacuum channel from the tip of the vacuum nozzle 201 to a vacuum connection 308 which couples to a vacuum generator 104 (FIG. 1) thereby providing the vacuum at the vacuum nozzle 201.

The vacuum quill 306 is mechanically coupled to a plate 310. The plate 310 is mechanically coupled to one end of a spring 312. The other end of the spring 312 is mechanically coupled to a lead screw 314 which is rotatably coupled to the stepper motor 108 (FIG. 1). The stepper motor 108 is held to a housing 317 by shoulder screws 316 which allow a very slight Z-axis movement of the stepper motor 108, for example, several thousandths of an inch (approximately 0.0762 mm), while being held secure to the housing 317. The stepper motor 108 is mechanically coupled to the load cell 112 and the load cell 112 is fixedly coupled to the housing 317. The load cell 112 has a sensor, such as a strain gauge 328, which provides an analog signal representing the amount of force being applied by the load cell 112 to the stepper motor 108. This analog signal can be coupled from the sensor 328 to the controller 102 (FIG. 1) for monitoring when the load cell 112 is applying force to the stepper motor 108. This analog signal can be used, for example, to indicate when a predetermined placement force is being applied by the vacuum nozzle 201 to a component. Typically, the load cell 112 has an operational range of one to four thousandths of an inch (0.0254 mm to 0.1016 mm) for monitoring deflection of a cantilevered beam mounted in the load cell 112.

The stepper motor 108 in combination with the lead screw 314 operates as a linear actuator in the Z-axis direction. By incrementally stepping the stepper motor 108 the lead screw 314 advances linearly in the Z-axis direction. As the lead screw 314 advances toward the plate 310, it applies a compression force on the spring 312. As the spring 312 compresses it increases the force against the plate 310. The plate 310 rests on a hard stop 324 that is mechanically coupled to the housing 317 and therefore the compression force of the spring 312 is maintained in the spring 312. For example, the spring can be pre-loaded with a predetermined spring force.

When an assembly component is engaged at the vacuum nozzle 201, after a pick operation, the robotic arm 300 then locates the end effector 100 at a work area for placing the assembly component at a desired location, for example, on a circuit supporting substrate. When the component at the vacuum nozzle 201 is properly located on (or oriented with) the circuit supporting substrate, the end effector 100 proceeds with the placement operation by applying a predetermined placement force to the component in the direction of the placement operation. For example, a placement operation can be oriented along the Z-axis (see FIG. 3) with respect to the end effector 100. The end effector 100, including the housing 317, is lowered by the robotic arm 300 in the Z-axis direction and the vacuum nozzle 201 and quill 306 apply a placement force to the component on the surface of the circuit supporting substrate. As the end effector 100 continues to move down in the Z-axis direction, the vacuum quill 306 and the plate 310 begin to retract into the housing 317 of the end effector 100. The plate 310 moves away from the hard stop 324 in the Z-axis direction. The spring force of the spring 312 is applied to the plate 310 which then mechanically couples the spring force to the vacuum quill 306 and the vacuum nozzle 201. This spring force corresponds to a placement force that is coupled to the component being placed on the circuit supporting substrate. As the housing 317 of the end effector 100 continues to be lowered in direction of the Z-axis, the vacuum quill 306 and plate 310 continue to further compress the spring 312. As the spring 312 compresses, it provides increasing compression force against the plate 310. When the spring 312 compresses to a predetermined length the placement force being applied to the component reaches its predetermined value.

For the controller 102 to adjust the amount of placement force applied to a component, the end effector 100 includes a linear position sensor 110 coupled to the vacuum nozzle 201 and vacuum quill 306 for sensing a variable linear position of the vacuum nozzle 201 along the Z-axis. The linear position sensor 110 provides a position indication signal to the controller 102. The position indication signal represents the variable linear position of the vacuum nozzle 201 along the Z-axis. The linear position of the vacuum nozzle 201 along the Z-axis is monitored by the controller 102 to determine the amount of placement force being applied by the vacuum nozzle 201 to a component in the direction of the placing operation, and optionally to determine a rate of change of the placement force being applied to the component. Specifically, the variable linear position of the vacuum nozzle 201 corresponds to the variable placement force applied to the component in the direction of the placement operation because the spring force varies in response to the vacuum nozzle 201 moving linearly along the Z-axis and the variable spring force corresponds to a variable placement force applied by the vacuum nozzle 201 to the component in the direction of the placement operation.

In the preferred embodiment of the present invention, the linear position sensor 110 comprises an inductive transducer 340,342 having an inductance value that varies in response to a change in the linear position of the vacuum nozzle 201 along the Z-axis. The inductive transducer 340,342 comprises an inductive coil 340 mechanically coupled to the housing 317 and a magnetically conductive structure, e.g., a metallic core 342, mechanically coupled to the movable vacuum quill 306 coupled to the vacuum nozzle 201. As the vacuum quill 306 moves linearly along the Z-axis, a varying portion of the magnetically conductive core 342 is disposed in proximity with (or optionally within) the inductive coil 340. The varying arrangement of the magnetically conductive core 342 relative to the inductive coil 340 varies an inductance value for the inductive transducer 340,342.

A indicator circuit, for example a frequency circuit, (not shown) is electrically coupled to the inductive transducer 340,342 for providing a signal, a frequency signal, in response to an inductance value of the inductive transducer 340,342. A value, for example a frequency of the frequency signal, varies in response to a varying inductance value of the inductive transducer 340,342. Since the inductance value of the inductive transducer 340,342 varies according to a linear position of the vacuum nozzle 201 along the Z-axis, the frequency of the frequency signal varies accordingly to provide indication of the linear position of the vacuum nozzle 201 along the axis of the placing operation.

Furthermore, a frequency detector (not shown) is electrically coupled to the frequency circuit (not shown) and to the controller 102. The frequency detector provides a position indication signal to the controller 102 in response to receiving the frequency signal from the frequency circuit. This position indication signal provides a feedback to the controller 102 while controlling the movement of the vacuum nozzle 201 along the Z-axis. The position indication signal allows the controller 102 to monitor the amount of placement force being applied to a component.

Figure 4:
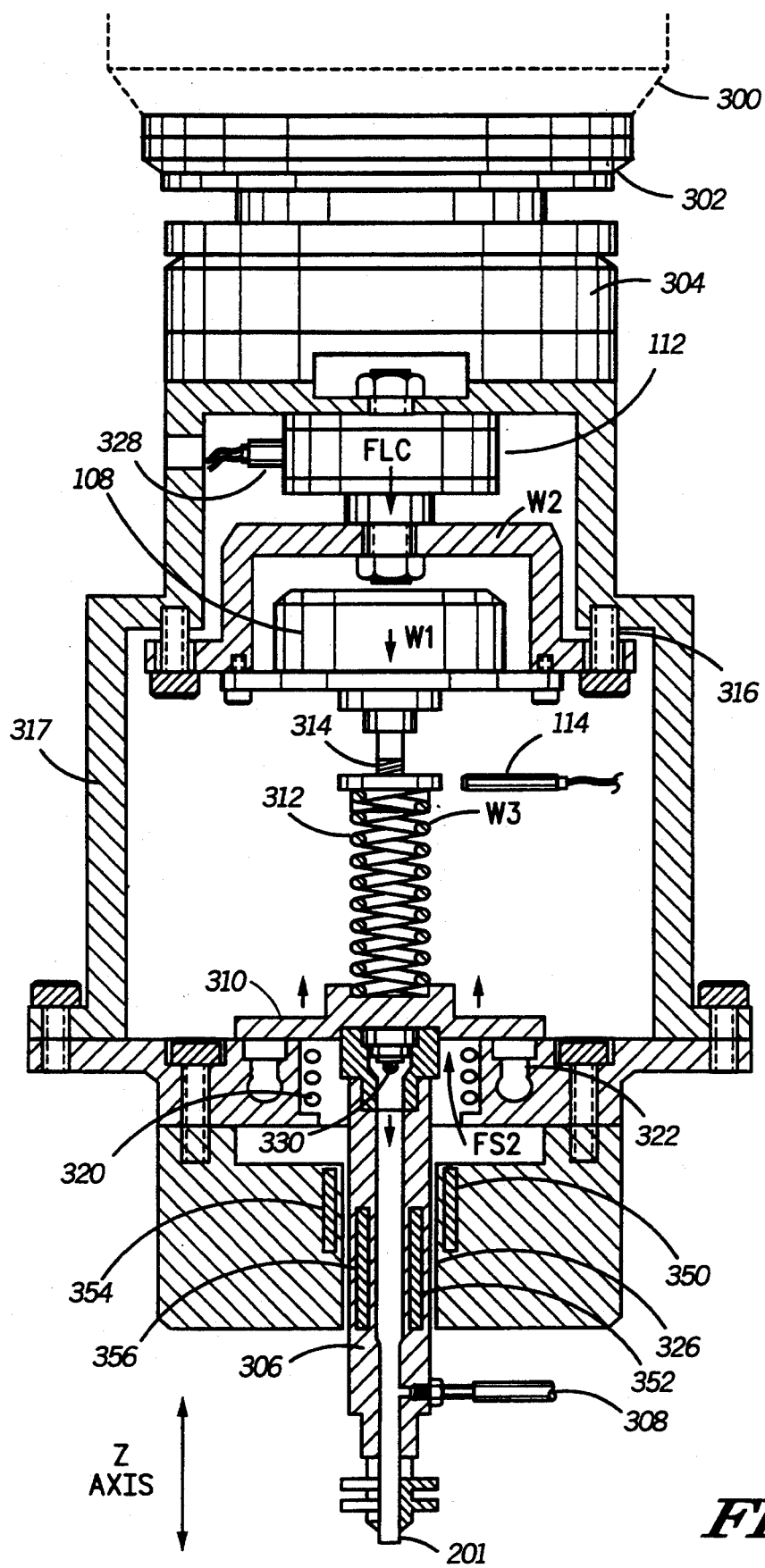
FIG. 4 is a cross-sectional side view of a vacuum nozzle end effector in accordance with an alternative embodiment of the present invention.

With reference to FIG. 4, in an alternative embodiment of the present invention the end effector 100 utilizes a capacitive transducer 350, 352 having a capacitance value that varies in response to a change in the linear position of the vacuum nozzle 201 along the Z-axis. The capacitive transducer 350,352 comprises a first capacitive plate structure 350 mechanically coupled to the housing 317 and a second capacitive plate structure 352 mechanically coupled to the movable vacuum quill 306 coupled to the vacuum nozzle 201. As the vacuum quill 306 moves linearly along the Z-axis, a varying portion of the second capacitive plate structure 352 is disposed in proximity with the first capacitive plate structure 350. The varying arrangement of the second capacitive plate structure 352 relative to the first capacitive plate structure 350 varies a capacitance value for the capacitive transducer 350, 352. Optionally, a second capacitive transducer 354, 356 can be located in the end effector 100 to additionally monitor movement of the vacuum nozzle 201 in a direction of the placement operation.

With reference to FIGS. 3 and 4, in certain applications, the desired placement force to be applied to a component is less than the total weight of the vacuum quill 306, the plate 310, the spring 312, and the stepper motor 108, and other associated weights of the mechanical system. To balance out these weights a second compression spring 320 is included. The second spring 320 applies compression force against the plate 310 which balances out the aforementioned weights to a net zero or as close thereto as desired for a particular operation. This is accomplished by selecting the second spring 320 to have the required compression characteristics to counter balance the weights.

Additionally, as the placement force becomes very light, the vacuum quill 306 may tend to bounce which can make it difficult to pick up components and possibly may drop components while moving the end effector 100 into position for the placing operation. Consequently, a vacuum port 322 is incorporated thereto to hold down the plate 310 against the hard stop 324 by using vacuum pressure. Preferably, the vacuum hold down of the plate 310 is performed during the picking of a component and while traveling to locate the component on the desired location for the placing operation. When the end effector is ready to place the component, the vacuum can be released from the vacuum port 322 which releases the plate 310 allowing the plate 310 to retract away from the hard stop 324 during the placing operation.

Preferably, a fluid bearing, for example an air bearing 326, is mechanically coupled to the vacuum quill 306 for maintaining an accurate gap between the vacuum quill 306 and the walls of a channel which guide the movement of the vacuum quill 306 in the Z-axis direction. This facilitates the movement of the vacuum quill 306. The use of the air bearing 326 is particularly valuable for very light placement force applications because other mechanical bearing alternatives provide additional weight, or frictional force, or both, to the vacuum quill 306 dynamics. Preferably, the shaft portion of the vacuum quill 306 is rectangularly shaped to keep the vacuum quill 306 from rotating in the channel.

Optionally, a light source 330 is provided in the vacuum quill 306 which can illuminate the component at the vacuum nozzle 201 through an internal shaft in the vacuum quill 306. This lighting of the component may be useful for optical recognition of the component during an automated placing operation.

An additional option is the home sensor 114 which can be utilized to provide feedback to the controller 102 to indicate when the linear actuator 108,314, is in an initialized position. The linear actuator 108,314, is then be controlled from a known starting position for adjusting the compression of the spring 312, such as may be necessary after initialization of the automated placing equipment.

Figure 5:
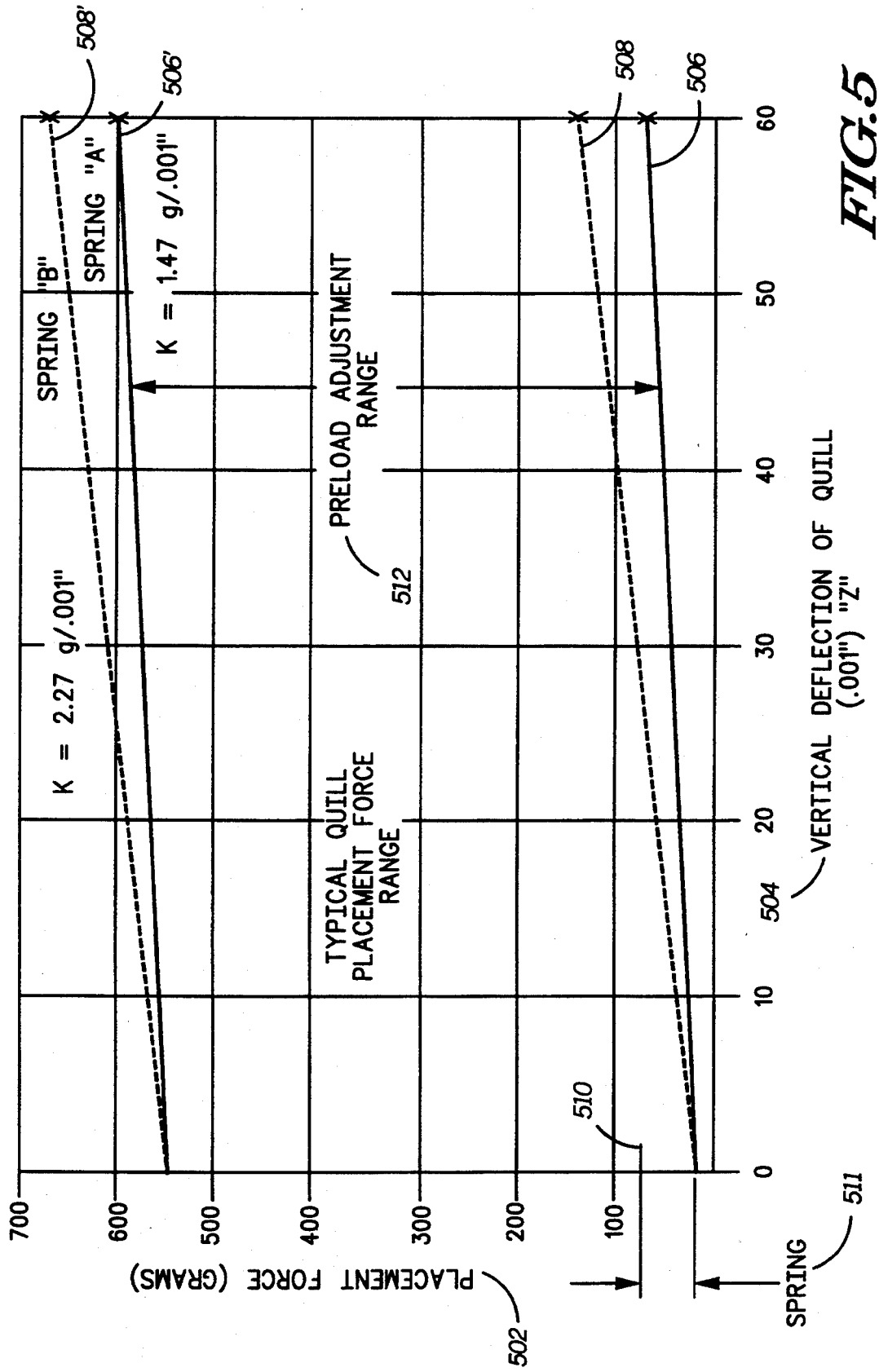
FIG. 5 is an exemplary chart of placement force versus Z-axis travel for a vacuum quill of an end effector according to the preferred embodiments of the present invention.

FIG. 5 is an exemplary graph of placement force 502 versus vertical (Z-axis) deflection 504 for distance traveled by the vacuum quill 306 during a placement operation. Two tactile feel curves 506, 508, are shown illustrating two substantially linear relationships between placement force 502 and deflection of the vacuum quill 306, where the two curves represent two different springs with different spring constants being used for the spring 312 (see FIGS. 3 and 4). For example, referring to the first placement force versus deflection (tactile feel) curve 506, the vacuum quill weight 510 (including all the weights of the moving quill system) is set at 65 grams. The spring 320 provides a counterbalancing compression force 511 opposing the total quill weights 510. By selecting the appropriate characteristics of the spring 320, the total quill weights 510 can be netted (offset) down to zero or as close thereto as desired for a particular application. This allows application of a very light placement force on the component, for example in the range of 10 grams or less.

For each tactile feel curve, 506, 508, the placement force 502 at the zero deflection point of the quill 306 can be set by driving the linear actuator 108, 314, to preload 512 a compression force on the spring 312. Of course, it can also be dependent on the balance between the compression force 511 of the second spring 320 and the total quill weights 510 (e.g., W1, W2, W3, W4, etc.), which is typically a constant for a particular end effector 100.

The slope of a particular tactile feel curve 506,508 is determined by a spring constant of the particular spring used for spring 312. When the quill 306 and the plate 310 retract away from the hard stop 324, the spring 312 compresses accordingly and applies increasing compression force to the plate 310 as indicated by the slope of the tactile feel curve.

For example, the first tactile feel curve 506 represents a first spring used for spring 312 and the second tactile feel curve 508 represent a second spring used for spring 312. Each separate spring has a different spring constant which is reflected by the different slopes of the curves 506, 508. The preloading range 512 for the curves 506, 508, is the range where each spring is initially compressed by the linear actuator 108, 314, as discussed above. Therefore, the operating range of the particular placing operation can be controlled by a preloading adjustment of the spring 312 before applying the placement force to the component. This operating range determines the amount of placement force 502 that will be applied to the component at a specific deflection distance 504 of the quill 306. Hence, for example, the deflection curves 506, 508, can operate at a very light placement force with a first preload adjustment. A second set of deflection curves 506', 508', shown represent the first curves having a second preload adjustment thereby operating at a higher placement force versus deflection range and providing a greater placement force to the component.

In summary, the characteristic of the placement force versus deflection curve 506,508 can be set by: a) the spring 312 that is used; b) how much the spring 312 is initially compressed (preloaded) by the linear actuator 108, 314; and c) the distance in the Z-axis direction, e.g., vertical deflection, traveled by the vacuum quill 306 before the placing operation is stopped.

Figure 6:
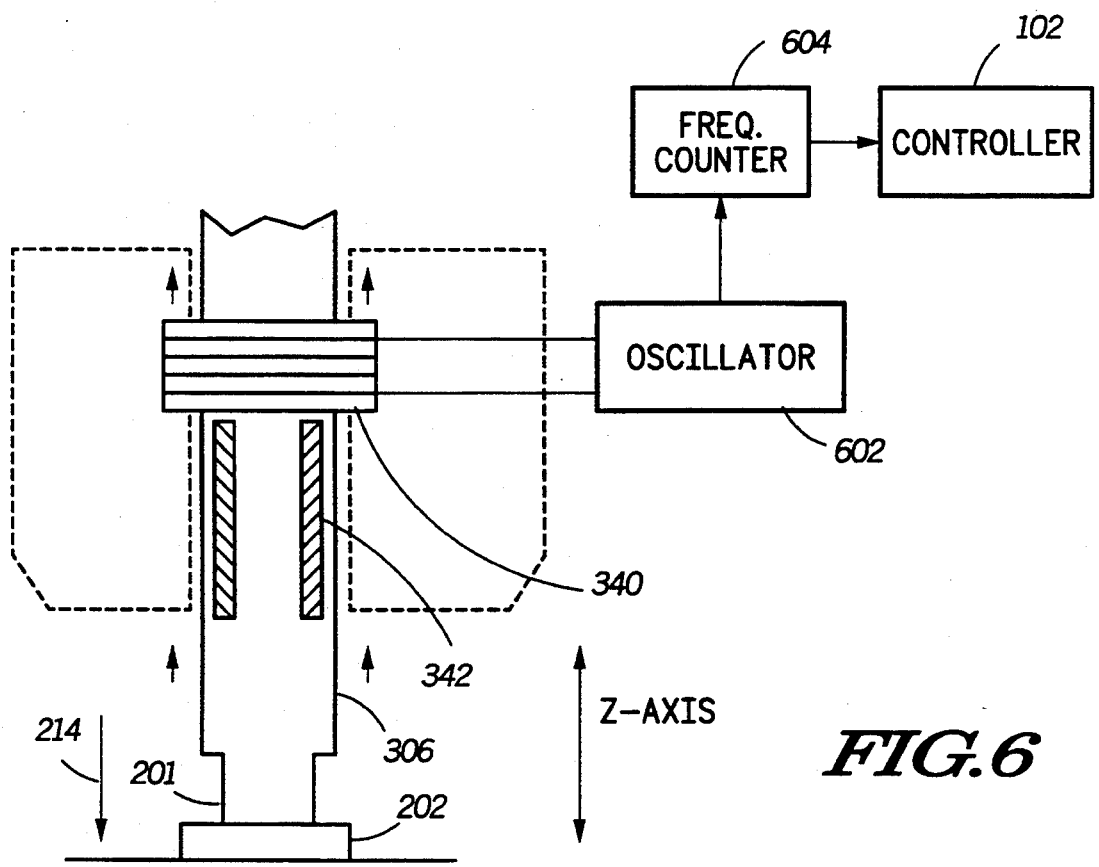
FIG. 6 is a block diagram illustrating a Z-axis position sensor for the preferred embodiment vacuum nozzle end effector of FIG. 3.
Figure 7:
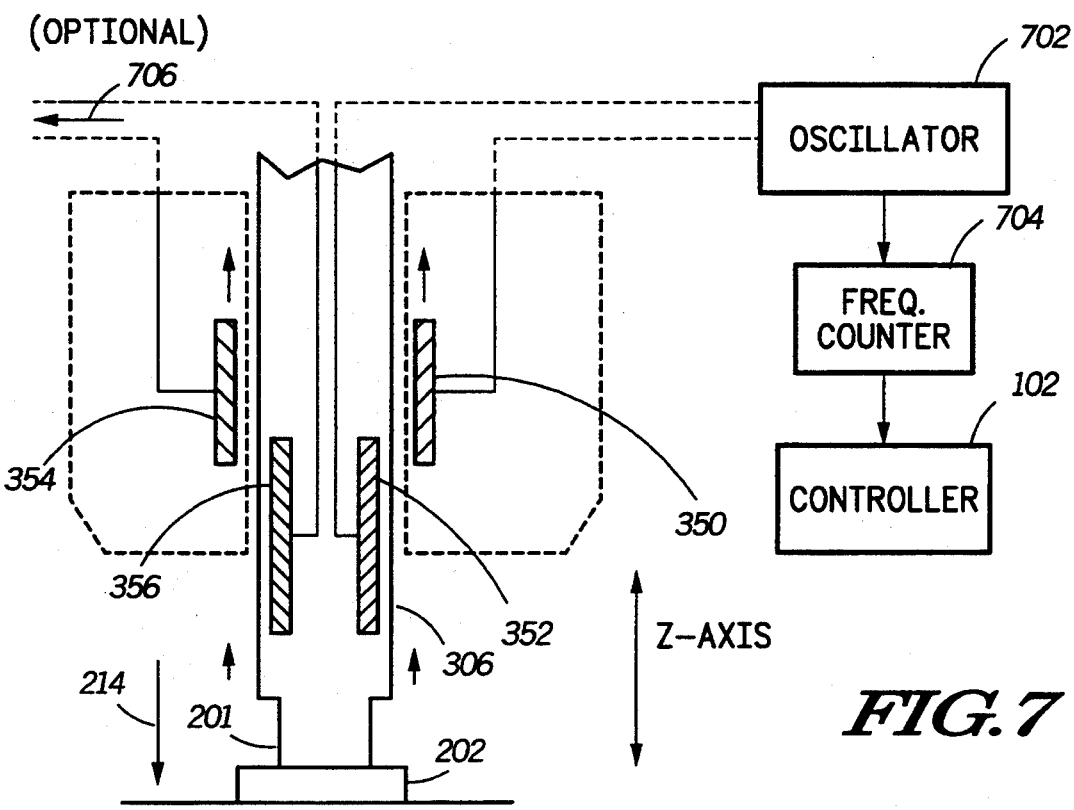
FIG. 7 is a block diagram illustrating a Z-axis position sensor for the alternative embodiment vacuum nozzle end effector of FIG. 4.

Once a tactile feel curve 506,508,506',508' is selected for a placement operation, the controller 102 (FIG. 1) monitors the amount of placement force being applied to a component during the placement operation by utilizing a linear position sensor 110 that senses the variable linear position (the vertical deflection) of the vacuum quill 306 along the Z-axis. Since the vacuum quill 306 is mechanically coupled to the vacuum nozzle 201, the sensor 110 also senses the variable linear position of the vacuum nozzle 201 along the Z-axis. FIGS. 6 and 7 illustrate two Z-axis position sensors in accordance with the preferred embodiments of the present invention.

Specifically, FIG. 6 is a block diagram illustrating a Z-axis position sensor 110 (FIG. 1) for the preferred embodiment of the vacuum nozzle end effector of FIG. 3. The linear position sensor 110 comprises an inductive transducer 340,342 having an inductance value that varies in response to a change in the linear position of the vacuum nozzle 201 along the axis of the placing operation. Further, the linear position sensor 110 comprises a frequency circuit 602, electrically coupled to the inductive transducer 340,342, for providing a frequency signal in response to a linear position of the vacuum nozzle 201 along the axis of the placing operation. Additionally, a frequency detector 604, e.g., a frequency counter or other frequency detecting device, is electrically coupled to the frequency circuit 602 and to the controller 102. The frequency detector 604, for example, the frequency counter 604 receives the frequency signal and in response thereto provides a position indication signal to the controller 102. The position indication signal represents a linear position of the vacuum nozzle 201 along the axis of the placing operation, e.g., along the Z-axis. The controller 102 can then adjust a variable spring force provided to the vacuum nozzle 201 in response to receiving the position indication signal. For example, the controller 102 can move the vacuum nozzle 201 along the Z-axis until it senses that the variable linear position of the vacuum nozzle 201 is at a predetermined value corresponding to a predetermined value of the placement force 214 being applied to the component 202 in the direction of the placing operation. Specifically, the controller 102 can move the housing 317 of the end effector 100 along the Z-axis causing the spring 312 to variably compress while providing a variable placement force 214 to the component 202. The spring 312 couples the variable spring force to the vacuum nozzle 201, and in response thereto the vacuum nozzle 201 couples a variable placement force 214 to the component 202. Consequently, the controller 102 can adjust the variable spring force that is coupled to the vacuum nozzle 201 and thereby adjusting the variable placement force 214 to the component 202.

Additionally, the controller 102 senses a variable rate of movement of the vacuum quill 306 along the Z-axis for providing a variable rate of changing spring force to the vacuum nozzle 201 for applying a variable rate of changing placement force 214 to the component 202. The rate of change of the placement force 214 being applied to a component 202 is important in certain applications. For example, when the end effector 100 monitors the rate of change of a placement force 214, e.g., an increasing placement force, being applied to the component 202 to provide the advantage, for example, of gradually increasing the placement force 214 up to a desired amount. This gradual increase in placement force can increase the reliability of setting the contacts between the component 202 and the circuit supporting substrate 200. Therefore, an automated placing equipment varies the amount of placement force 214 applied to a component 202 and monitors the rate of change of the varying placement force. In this way, the automated placement equipment controls the rate of change of the varying placement force 214 while adjusting it to a predetermined placement force being applied to the component 202.

As shown in FIG. 6, the inductive transducer 340,342 comprises an inductive coil 340 fixedly coupled to the housing 317. It further includes a magnetically conductive structure, e.g., a metallic core 342, mechanically coupled to the movable vacuum quill 306 coupled to the vacuum nozzle 201. The vacuum quill 306, at least about the region of the inductive coil 340, is constructed of a non-magnetically conductive material, such as a plastic material. As the vacuum quill 306 moves linearly along the Z-axis, a varying portion of the magnetically conductive core 342 is disposed in proximity with (or optionally within) the inductive coil 340. The varying arrangement of the magnetically conductive structure 342 relative to the inductive coil 340 varies an inductance value for the inductive transducer 340,342. This change in inductance causes a corresponding change in the frequency of the frequency circuit 602, e.g., the oscillator 602.

An alternative Z-axis position sensor 110 (FIG. 1) is illustrated in FIG. 7. This sensor 110 corresponds to the alternative embodiment vacuum nozzle end effector of FIG. 4. A capacitive transducer 350,352 has a capacitance value that varies in response to a change in the linear position of the vacuum nozzle 201 along the Z-axis. The capacitive transducer 350,352 comprises a first capacitive plate structure 350 mechanically coupled to the housing 317 and a second capacitive plate structure 352 mechanically coupled to the movable vacuum quill 306 coupled to the vacuum nozzle 201. As the vacuum quill 306 moves linearly along the Z-axis, a varying portion of the second capacitive plate structure 352 is disposed in proximity with the first capacitive plate structure 350. The varying arrangement of the second capacitive plate structure 352 relative to the first capacitive plate structure 350 varies a capacitance value for the capacitive transducer 350,352. Optionally, a second capacitive transducer 354,356 can be located in the end effector 100 to additionally monitor movement of the vacuum nozzle 201 in a direction of the placement operation.

Figure 10:
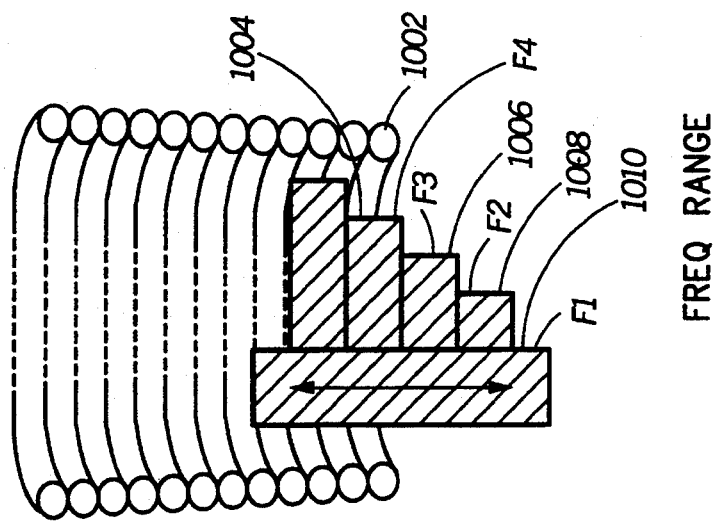
FIGS. 8, 9, and 10 are cross-sectional side views of three exemplary configurations for the Z-axis position sensor for the preferred embodiment vacuum nozzle end effector of FIG. 3.
Figure 9:
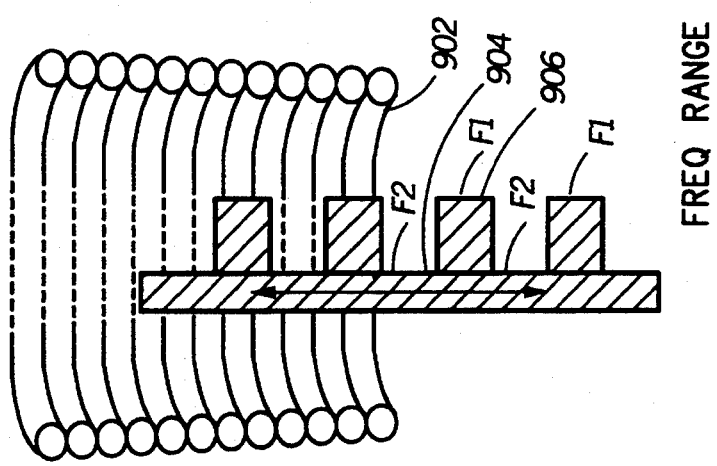
Figure 8:
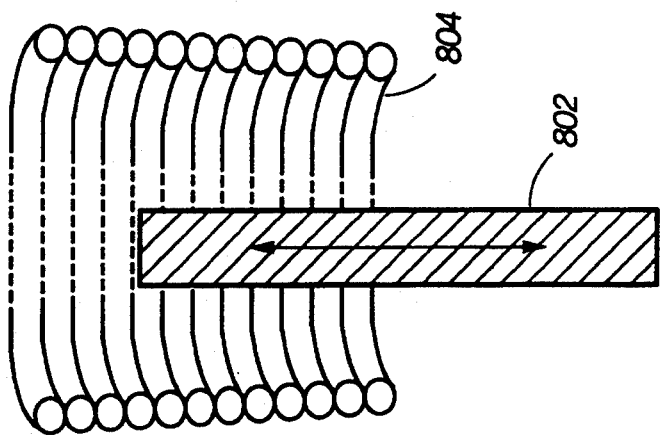

FIGS. 8, 9, and 10 are cross-sectional side views of three exemplary configurations for the Z-axis position sensor 110 for the preferred embodiment vacuum nozzle end effector 100 of FIG. 3. As discussed above, the inductive transducer 340, 342 experiences a change in inductance in response to the linear movement of the vacuum quill 306 along the Z-axis. As shown in FIG. 8, the change in inductance can be in a generally continuous fashion while the magnetically conductive structure 802 travels in proximity of the inductive coil 804.

FIG. 9 shows a first alternative arrangement for the magnetically conductive structure 904 traveling in proximity to the inductive coil 902. The magnetically conductive structure 904 comprises a first portion 906 of a first dimension and it also comprises a second portion 904 of a second dimension. When the first portion 906 is generally in proximity to the inductive coil 902 it causes an inductance for the inductive transducer 902,904 that corresponds to a first frequency range (f1) for the oscillator circuit 602 (FIG. 6). When the second portion 904 is alternatively in proximity to the inductive coil 902 it causes an inductance for the inductive transducer 902,904 that corresponds to a second frequency range (f2) for the oscillator circuit 602 (FIG. 6). These alternating step functions for the frequency signal corresponds to units of changing linear position along the Z-axis for the vacuum quill 306. The alternating frequency steps for the frequency signal correspond to step function changes in the position indication signal coupled to the controller 102.

FIG. 10 illustrates a second alternative arrangement for the magnetically conductive structure 1010 traveling in proximity to the inductive coil 1002. The magnetically conductive structure 1010 comprises a plurality of different dimension portions 1004,1006,1008,1010. Each of these different dimensions of the magnetically conductive structure 1010 when in proximity to the inductive coil 1002 causes a different range of inductance for the inductive transducer 1002,1010 which corresponds to a different frequency range for the frequency signal (f1, f2, f3, and f4). These different frequency ranges for the frequency signal from the oscillator circuit 602 correspond to step function changes in the position indication signal coupled from the frequency counter 604 to the controller 102.

In summary, the discussion above illustrates three alternative configurations for the inductive transducer for the linear position sensor 110. The change in inductance can be generally a continuous function, as shown in FIG. 8. It can also be an alternating step function, as shown in FIG. 9. Finally, it can be a plurality of varying values, e.g., an increasing or decreasing step function. These alternative configurations can serve particular applications for monitoring the linear movement of the vacuum quill 306 along the Z-axis for controlling the amount, or the rate of change, or both of the variable placement force being applied to the component 202.

Figure 11:
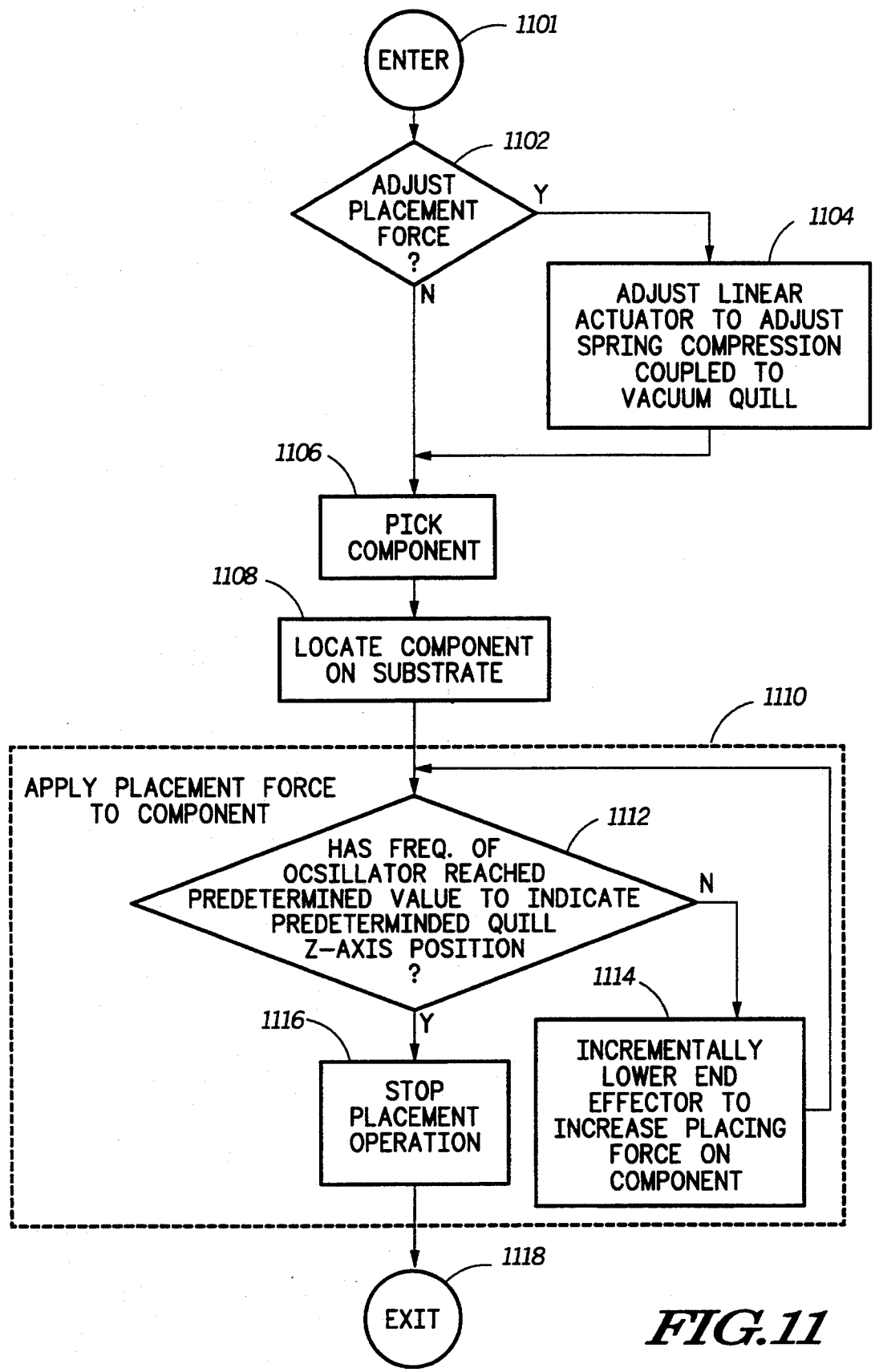
FIG. 11 is a flow diagram illustrating an operational sequence for the controller of FIG. 1 in accordance with the preferred embodiment of the present invention.

FIG. 11 is a flow diagram illustrating an operational sequence for the controller 102 according to the preferred embodiment of the present invention. In a pick and place operation for a flexible automated manufacturing process the controller 102 enters 1101 the operational sequence by determining that a component is to be placed. The controller 102 then determines whether adjustment of the placement force is necessary for placing the component, step 1102. If adjustment is necessary, the controller 102 adjusts the placement force for the component, step 1104. As discussed earlier, this is accomplished by the controller 102 controlling the linear actuator 108, 314, to set the initial compression (preloading) of the spring 312 at the desired range of spring force for placing the component. Alternatively, if the controller 102 determines that the position of the linear actuator 108, 314, is already at the desired range of compression for the spring 312, step 1102, the controller 102 does not have to further adjust the spring force. The end effector 100 then is moved, such as by a robotic arm, to pick up the component, step 1106. Optionally, the vacuum hold down of the plate 310 by the vacuum port 322 is activated to prevent the vacuum quill 306 from bouncing. After the end effector 100 picks up the component, the end effector 100 is moved to locate the component on the circuit supporting substrate for the placement operation, step 1108. Subsequently, the end effector 100 moves in the Z-axis to apply the placement force to the component, step 1110.

Within step 1110, the controller 102 monitors the Z-axis linear position sensor 110 to detect when the vacuum quill 306 and plate 310 have retracted into the housing 317 of the end effector 100 to a predetermined linear position. If the controller 102 does not detect from the linear position sensor 110 that the vacuum quill 306 is at a predetermined linear position, step 1112, the controller 102 incrementally lowers the end effector 100, step 1114, and continues to monitor the linear position sensor 110, step 1112. On the other hand, when the controller 102 determines that the linear position sensor 110 indicates that the vacuum quill 306 is at the predetermined linear position, step 1112, then the controller 102 stops the placement operation, at step 1116. At this point, the predetermined placement force is being applied to the component on the circuit supporting substrate. After the component is placed with the required placement force and the controller exits the instant placement operation, step 1118, the controller 102 then determines whether more components are to be placed and repeats the placing operation as necessary.

It is clear by now that the controller 102 can adjust the compression of the spring 312 between the placing of different components thereby providing predetermined placement force for each component as necessary for the particular placing operation. The controller 102 knows the position of the linear actuator 108, 134 and also knows the predetermined placement force that is desired for placing a component. The controller 102 can adjust the compression of the spring 312 by driving the linear actuator 108, 314 to a new position which corresponds to the predetermined compression for the spring 312 for applying a predetermined placement force to the component in the next placing operation. The new compression force of the spring 312 will be applied to the plate 310 and to the vacuum quill 306 when the vacuum quill 306 travels back up into the housing 317. The amount of placement force and the rate of change of the placement force being applied to a component are controlled by the controller 102. The operation of the end effector 100 is flexible from placement operation to placement operation for performing accurate and repeatable component placements by dynamically adjusting the placement force applied to the components being placed.

In summary, the placement force of the vacuum nozzle end effector 100 is adjusted for each individual placement operation as required by the particular component being placed. Furthermore, the force deflection curve or tactile feel curve is set for the particular application allowing a wide range of placement force and deflection distance as necessary. Optionally, the light source 330 (FIG. 3) can provide lighting to the vacuum nozzle 201 to assist in optical recognition of components being placed. The vacuum nozzle 201 being capable of dynamically adjustable placement force for placing different components, is especially useful for placing surface mount IC components, for example surface mount technologies including Controlled Collapse Chip Connection (C4), Controlled Collapse Chip Carrier Connection (C5), and Overmolded Pad Array Carrier (OMPAC).

What is claimed:

1. An apparatus capable of automated assembly, comprising:
    a vacuum nozzle for aspirating and securing a component;
    a vacuum quill mechanically coupled to the vacuum nozzle, the vacuum quill capable of traveling in a Z-axis being guided by a channel in the end effector;
    an air bearing, mechanically coupled to the vacuum quill in the channel, for facilitating movement of the vacuum quill in the channel;
    a spring mechanically coupled to the vacuum nozzle for providing a variable spring force thereto in a direction of a placing operation, the variable spring force varying in response to the vacuum nozzle moving linearly along the Z-axis of the placing operation, the variable spring force corresponding to a variable placement force being applied by the vacuum nozzle to the component in the Z-axis direction of the placing operation; and
    a linear position sensor coupled to the vacuum nozzle for sensing a variable linear position of the vacuum nozzle along the Z-axis for providing a position indication signal representing the linear position of the vacuum nozzle for adjusting the variable placement force being applied by the vacuum nozzle to the component, the variable linear position of the vacuum nozzle corresponds to the variable placement force applied to the component in the Z-axis direction of the placing operation.

2. The apparatus of claim 1, further comprising:
    a controller electrically coupled to the linear position sensor for receiving the position indication signal therefrom representing a linear position of the vacuum nozzle along the Z-axis of the placing operation, said controller adjusting the variable spring force provided to the vacuum nozzle, in response to receiving the position indication signal, for adjusting the variable placement force applied by the vacuum nozzle to the component.

3. The apparatus of claim 2, wherein the linear position sensor comprises:
    an inductive transducer having an inductance value that varies in response to a change in the linear position of the vacuum nozzle along the Z-axis of the placing operation;
    a frequency circuit, electrically coupled to the inductive transducer, for providing a frequency signal in response to the linear position of the vacuum nozzle along the Z-axis of the placing operation; and
    a frequency detector, electrically coupled to the frequency circuit and the controller, for providing the position indication signal to the controller in response to receiving the frequency signal from the frequency circuit.

4. The apparatus of claim 2, wherein the linear position sensor comprises:
    a capacitive transducer having a capacitance value that varies in response to a change in the linear position of the vacuum nozzle along the Z-axis of the placing operation;
    a frequency circuit, electrically coupled to the capacitive transducer, for providing a frequency signal in response to the linear position of the vacuum nozzle along the Z-axis of the placing operation; and
    a frequency detector, electrically coupled to the frequency circuit and the controller, for providing the position indication signal to the controller in response to receiving the frequency signal from the frequency circuit.

5. The apparatus of claim 2, further comprising:
    a movable housing, the spring being mechanically coupled thereto such that when the housing is moved along the Z-axis of the placing operation the spring provides the variable spring force to the vacuum nozzle for adjusting the variable placement force applied to the component in the direction of the placing operation.

6. The apparatus of claim 5, wherein the movable housing moves at a variable rate of movement in the Z-axis for providing a variable rate of spring force to the vacuum nozzle for applying a variable rate of placement force to the component.

7. A method in an automated manufacturing process for placing a component, comprising the steps of:
    (a) aspirating and securing the component by a vacuum nozzle;
        (a1) mechanically coupled a vacuum quill capable of traveling in a Z-axis being guided by a channel in the end effector;

(a2) mechanically coupling an air bearing to the vacuum quill in the channel for facilitating movement of the vacuum quill in the channel;

(b) placing the component at a predetermined location by moving the vacuum nozzle to the predetermined location;

(c) providing a variable spring force to the vacuum nozzle in a direction of a placing operation, the variable spring force varying in response to the vacuum nozzle moving linearly along the Z-axis of the placing operation;

(d) applying a variable placement force by the vacuum nozzle to the component in the direction of the placing operation corresponding to the variable spring force; and (e) sensing a variable linear position of the vacuum nozzle along the Z-axis of the placing operation, the variable linear position of the vacuum nozzle corresponding to the step (d) of applying the variable placement force to the component in the Z-axis direction of the placing operation.

8. The method of claim 7, further comprising the step of:

adjusting the variable placement force of step (d) being applied to the component in the Z-axis direction of the placing operation; and moving the vacuum nozzle along the Z-axis of the placing operation until the sensing step senses the variable linear position of the vacuum nozzle at a predetermined value corresponding to a predetermined value of the variable placement force applied to the component in the Z-axis direction of the placing operation.

9. A robotic end effector for automated assembly, comprising:

a vacuum nozzle for aspirating and securing a component;

a vacuum quill mechanically coupled to the vacuum nozzle, the vacuum quill capable of traveling in a Z-axis being guided by a channel in the end effector;

an air bearing, mechanically coupled to the vacuum quill in the channel, for facilitating movement of the vacuum quill in the channel;

a spring mechanically coupled to the vacuum nozzle for providing a variable spring force thereto in a direction of a placing operation, the variable spring force varying in response to the vacuum nozzle moving linearly along Z-axis of the placing operation, the variable spring force corresponding to a variable placement force being applied by the vacuum nozzle to the component in the Z-axis direction of the placing operation;

a linear position sensor coupled to the vacuum nozzle for sensing a variable linear position of the vacuum nozzle along the Z-axis of the placing operation and for providing a position indication signal representing a linear position of the vacuum nozzle for adjusting the variable placement force being applied by the vacuum nozzle to the component, the variable linear position of the vacuum nozzle corresponds to the variable placement force applied to the component in the Z-axis direction of the placing operation; and a controller electrically coupled to the linear position sensor, for receiving the position indication signal therefrom representing the linear position of the vacuum nozzle along the Z-axis of the placing operation, said controller adjusting the variable spring force provided to the vacuum nozzle, in response to receiving the position indication signal, for adjusting the variable placement force applied by the vacuum nozzle to the component.

10. The apparatus of claim 9, wherein the linear position sensor comprises:

an inductive transducer having an inductance value that varies in response to a change in the linear position of the vacuum nozzle along the Z-axis of the placing operation;

a frequency circuit, electrically coupled to the inductive transducer, for providing a frequency signal in response to the linear position of the vacuum nozzle along the Z-axis of the placing operation; and a frequency detector, electrically coupled to the frequency circuit and the controller, for providing the position indication signal to the controller in response to receiving the frequency signal from the frequency circuit.

11. The apparatus of claim 9, wherein the linear position sensor comprises:

a capacitive transducer having a capacitance value that varies in response to a change in the linear position of the vacuum nozzle along the Z-axis of the placing operation;

a frequency circuit, electrically coupled to the capacitive transducer, for providing a frequency signal in response to the linear position of the vacuum nozzle along the Z-axis of the placing operation; and a frequency detector, electrically coupled to the frequency circuit and the controller, for providing the position indication signal to the controller in response to receiving the frequency signal from the frequency circuit.

12. The apparatus of claim 9, further comprising:

a movable housing, the spring being mechanically coupled thereto such that when the movable housing is moved along the Z-axis of the placing operation the spring provides the variable spring force to the vacuum nozzle for adjusting the variable placement force applied to the component in the direction of the placing operation.

13. The apparatus of claim 12, wherein the movable housing can move at a variable rate of movement in the Z-axis for providing a variable rate of spring force to the vacuum nozzle for applying a variable rate of placement force to the component.

14. A robotic end effector, comprising:

a movable housing;

a vacuum nozzle for aspirating and securing a component;

a vacuum quill mechanically coupled to the vacuum nozzle, the vacuum quill capable of traveling in a Z-axis being guided by a channel in the end effector;

an air bearing, mechanically coupled to the vacuum quill in the channel, for facilitating movement of the vacuum quill in the channel;

a spring having first and second ends oriented for compression in the Z-axis, the first end of the spring being mechanically coupled to the vacuum quill and the second end being mechanically coupled to the movable housing for providing a variable spring force to the vacuum quill and thereby to the vacuum nozzle in a direction of a placing operation, the variable spring force varying in response to the vacuum quill and the vacuum nozzle moving linearly along the Z-axis, the variable spring force corresponding to a variable placement force applied by the vacuum nozzle to the component in the Z-axis direction of the placing operation;

a linear position sensor coupled to the vacuum nozzle for sensing a variable linear position of the vacuum quill and the vacuum nozzle along the Z-axis and for providing a position indication signal representing a linear position of the vacuum nozzle along the Z-axis for adjusting the variable placement force being applied by the vacuum nozzle to the component, the variable linear position of the vacuum nozzle corresponding to the variable placement force applied by the vacuum nozzle to the component in the Z-axis direction of the placing operation; and a controller for controlling movement of the movable housing, the controller, being electrically coupled to the linear position sensor, the controller further comprising:

means for determining the movement of the movable housing for variably compressing the spring wherein the variable spring force is applied to the vacuum quill and the vacuum nozzle corresponding to the variable placing force applied by the vacuum nozzle to the component, and means for monitoring the position indication signal received from the linear position sensor to determine when to stop a movement of the movable housing corresponding to a predetermined linear position of the vacuum quill and vacuum nozzle in the Z-axis for the placing operation, the predetermined linear position of the vacuum quill and the vacuum nozzle corresponding to a predetermined spring force being provided to the vacuum quill thereby causing a predetermined placement force to be applied to the component.

15. The robotic end effector of claim 14, wherein the controller is capable of controlling a variable rate of movement of the movable housing in the Z-axis for providing a variable rate of spring force to the vacuum quill and thereby to the vacuum nozzle for applying a variable rate of the variable placement force to the component.

* * * * *